(12) United States Patent
Campbell et al.

(10) Patent No.: US 7,086,247 B2
(45) Date of Patent: Aug. 8, 2006

(54) COOLING SYSTEM AND METHOD EMPLOYING AUXILIARY THERMAL CAPACITOR UNIT FOR FACILITATING CONTINUOUS OPERATION OF AN ELECTRONICS RACK

(75) Inventors: Levi A. Campbell, New Paltz, NY (US); Richard C. Chu, Hopewell Junction, NY (US); Michael J. Ellsworth, Jr., Lagrangeville, NY (US); Madhusudan K Iyengar, Rhinebeck, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 204 days.

(21) Appl. No.: 10/930,079

(22) Filed: Aug. 31, 2004

(65) Prior Publication Data

US 2006/0042289 A1    Mar. 2, 2006

(51) Int. Cl.
*F25D 23/12* (2006.01)
(52) U.S. Cl. ............... 62/259.2; 165/104.33; 361/698
(58) Field of Classification Search ............ 62/118, 62/132, 259.2, 434; 165/80.4, 104.33; 361/698–701
See application file for complete search history.

(56) References Cited

U.S. PATENT DOCUMENTS

| | | | | |
|---|---|---|---|---|
| 3,992,894 A | * | 11/1976 | Antonetti et al. | 62/129 |
| 5,323,847 A | * | 6/1994 | Koizumi et al. | 165/104.33 |
| 5,455,458 A | * | 10/1995 | Quon et al. | 257/714 |
| 5,966,957 A | * | 10/1999 | Malhammar et al. | 62/259.2 |
| 6,181,558 B1 | | 1/2001 | Gordon | 361/699 |
| 6,213,194 B1 | * | 4/2001 | Chrysler et al. | 165/80.3 |
| 6,397,618 B1 | | 6/2002 | Chu et al. | 62/259.2 |

(Continued)

FOREIGN PATENT DOCUMENTS

JP    2000-310459 A    * 11/2000

OTHER PUBLICATIONS

"Cooling System and Method Employing At Least Two Modular Cooling Units for Ensuring Cooling Of Multiple Electronics Subsystems," Chu, et al., U.S. Appl. No. 10/726,377, filed Dec. 3, 2003.

(Continued)

*Primary Examiner*—Mohammad M. Ali
(74) *Attorney, Agent, or Firm*—Lily Neff, Esq.; Kevin P. Radigan, Esq.; Heslin Rothenberg Farley & Mesiti, P.C.

(57) ABSTRACT

A cooling approach is provided for cooling an electronics subsystem, such as an electronics rack. The cooling approach includes a coolant conditioning unit and a thermal capacitor unit. The coolant conditioning unit has a heat exchanger, a first cooling loop and a second cooling loop. The first cooling loop receives facility coolant from a facility coolant source and passes at least a portion thereof to the heat exchanger. The second cooling loop provides system coolant to the electronics subsystem, and expels heat in the heat exchanger from the electronics subsystem to the facility coolant in the first cooling loop. The thermal capacitor unit is in fluid communication with the second cooling loop to maintain temperature of the system coolant within a defined range for a period of time upon shutdown or failure of the facility coolant in the first cooling loop, thereby allowing continued operation of the electronics subsystem.

23 Claims, 6 Drawing Sheets

U.S. PATENT DOCUMENTS

| | | | | |
|---|---|---|---|---|
| 6,621,702 B1 | 9/2003 | Elias et al. | | 361/700 |
| 6,621,707 B1 * | 9/2003 | Ishimine et al. | | 361/721 |
| 6,628,520 B1 * | 9/2003 | Patel et al. | | 361/696 |
| 6,631,755 B1 | 10/2003 | Kung et al. | | 165/46 |
| 6,702,003 B1 | 3/2004 | Hsiao et al. | | 165/80.3 |
| 6,714,412 B1 | 3/2004 | Chu et al. | | 361/699 |
| 6,807,056 B1 * | 10/2004 | Kondo et al. | | 361/689 |
| 6,820,684 B1 * | 11/2004 | Chu et al. | | 165/104.33 |
| 6,889,509 B1 * | 5/2005 | Cader et al. | | 62/118 |
| 6,991,024 B1 * | 1/2006 | Goodson et al. | | 165/80.4 |
| 7,000,467 B1 * | 2/2006 | Chu et al. | | 73/299 |
| 7,012,807 B1 * | 3/2006 | Chu et al. | | 361/699 |

OTHER PUBLICATIONS

"Cooling System and Method Employing Multiple Dedicated Coolant Conditioning Units for Cooling Multiple Electronics Subsystems," U.S. Appl. No. 10/726,347, filed Dec. 3, 2003.

* cited by examiner fig. 1 fig. 3 fig. 4 fig. 5A fig. 5B fig. 6

US 7,086,247 B2

COOLING SYSTEM AND METHOD EMPLOYING AUXILIARY THERMAL CAPACITOR UNIT FOR FACILITATING CONTINUOUS OPERATION OF AN ELECTRONICS RACK

CROSS-REFERENCE TO RELATED APPLICATIONS

This application contains subject matter which is related to the subject matter of the following applications, each of which is assigned to the same assignee as this application and each of which is hereby incorporated herein by reference in its entirety:

"Cooling System and Method Employing at Least Two Modular Cooling Units for Ensuring Cooling of Multiple Electronics Subsystems," Chu et al., U.S. application Ser. No. 10/726,377, filed Dec. 3, 2003; and "Cooling System and Method Employing Multiple Dedicated Coolant Conditioning Units for Cooling Multiple Electronics Subsystems," Chu et al., U.S. application Ser. No. 10/726,347, filed Dec. 3, 2003.

TECHNICAL FIELD

The present invention relates in general to cooling assemblies and other apparatus used for removing heat from electronic devices, modules and systems. More particularly, this invention relates to cooling systems and methods for liquid cooling of electronic subsystems, such as electronics racks, utilizing multiple coolant conditioning units, each with an auxiliary thermal capacitor unit in fluid communication with system coolant.

BACKGROUND OF THE INVENTION

Heat flux dissipated by electronic equipment, such as microprocessors and power supplies, is again reaching levels that require cooling other than simple air cooling as a means of controlling component temperature. Liquid cooling (e.g., water cooling) is an attractive technology to manage these higher heat fluxes. The liquid absorbs the heat dissipated by the components/modules in an efficient manner, i.e., with minimal temperature rise from the liquid to the component being cooled. Typically, the heat is ultimately transferred from the liquid out into the outside environment. Otherwise, the liquid coolant would continuously rise in temperature.

Figure 1:
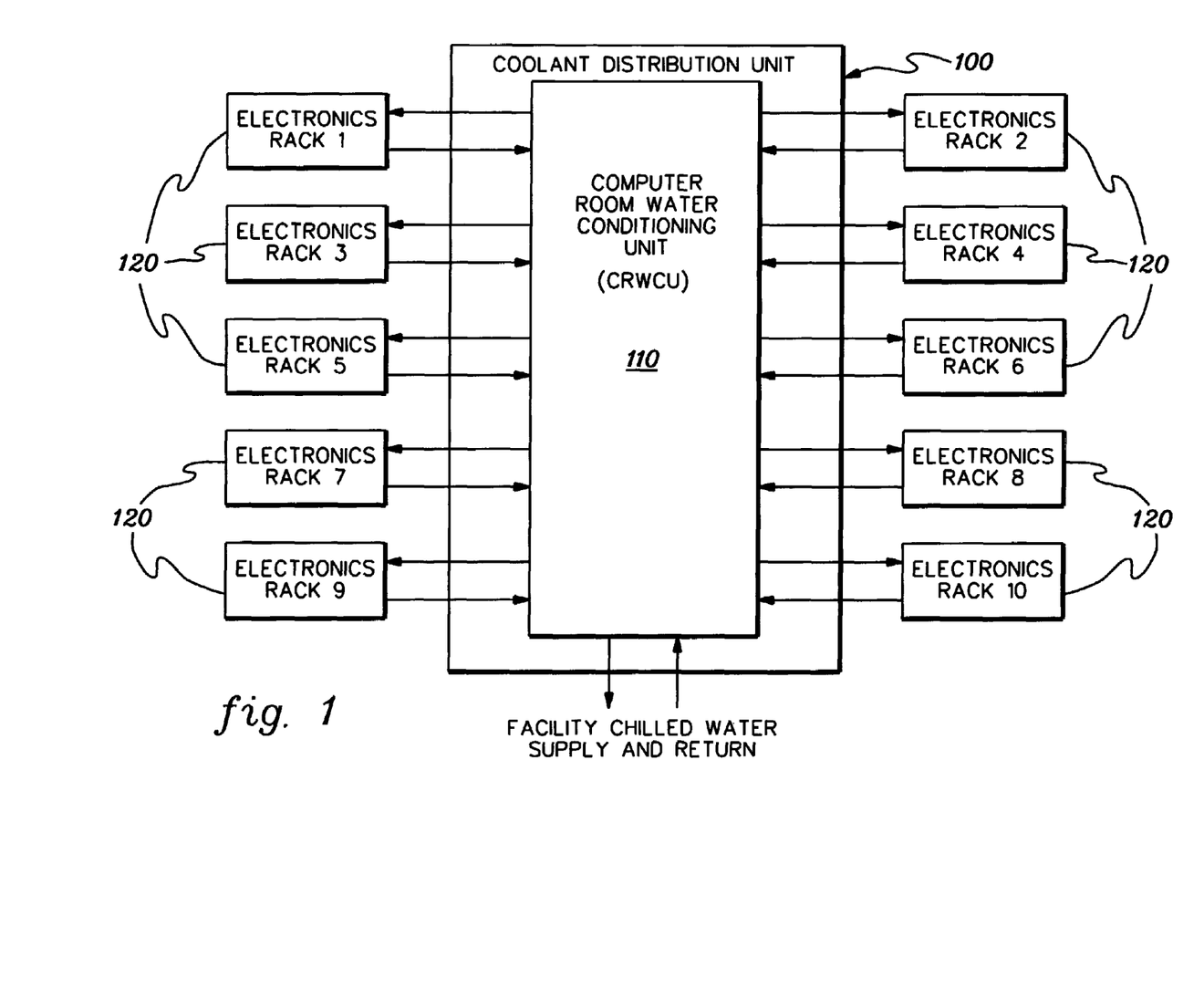
FIG. 1 depicts a conventional coolant distribution unit for a computer room.

From the 1970's through the early 1990's, International Business Machines Corporation accomplished this task by circulating cooling liquid via a coolant distribution unit 100 (FIG. 1). Coolant distribution unit 100 included a single, large computer room water conditioning unit (CRWCU) 110, which distributed conditioned chilled water to the various electronics racks 120 of a mainframe computer system to be cooled. Conventionally, the electronics racks of the mainframe computer included memory frames, processor frames, input/output frames, power frames, etc. Operationally, the CRWCU 110 received customer chilled water which was then used to supply conditioned cooled water to the individual electronics racks of the computer room.

Figure 2:
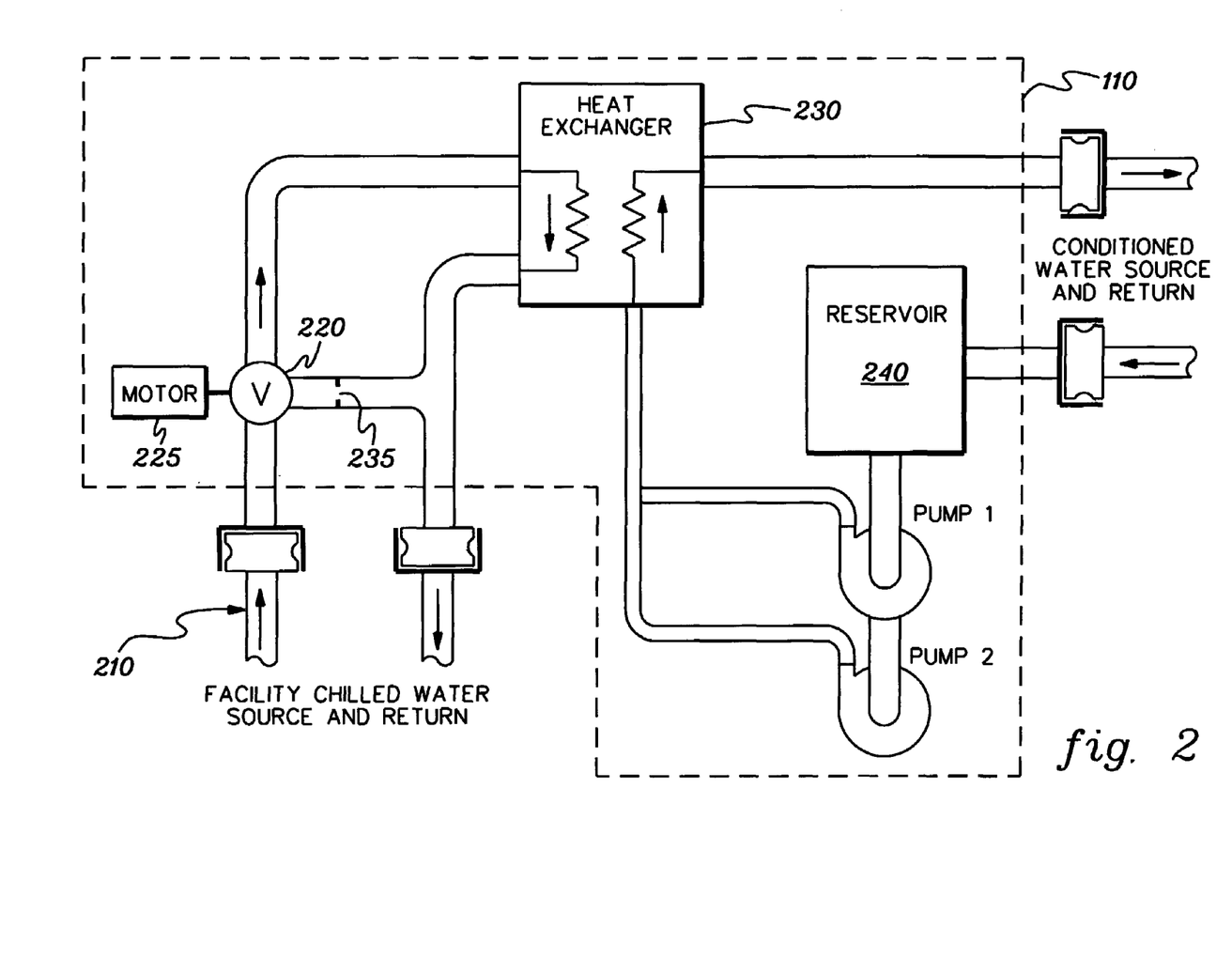
FIG. 2 is a schematic of a conventional computer room water conditioning unit (CRWCU) such as employed by the coolant distribution unit of FIG. 1.

As shown in FIG. 2, the CRWCU 110 included a primary cooling loop wherein building chilled water was supplied 210 and passed through a single control valve 220 driven by a motor 225. Valve 220 determined an amount of building chilled water to be passed through a heat exchanger 230, with a portion of the building chilled water possibly being returned directly to the return via a bypass orifice 235. The CRWCU further included a second cooling loop with a reservoir tank 240 from which water was pumped either by pump 1 or pump 2 into the heat exchanger 230 for conditioning and output therefrom as a conditioned water source to the electronics racks to be cooled within the computer room. The computer room water conditioning unit normally stood separate from the electronics frames, and again, would supply system water (typically maintained at about 22° C.) to all electronics frames of the computer room.

The coolant distribution unit, and more particularly, the computer room water conditioning unit (CRWCU) depicted in FIGS. 1 & 2, contains a single heat exchanger, a single reservoir, a single control valve, and redundant pumps. Thus, in the case of a failed pump, the CRWCU would automatically switch to the redundant pump, but any other malfunction in the coolant distribution unit would have brought down the whole mainframe system. For example, if the heat exchanger, or control valve, or building chilled water source failed, then the entire mainframe system in the computer room would also fail. Redundant mainframe computers would have been on the computer room floor to allow continuation of processing (in a degraded mode) until the downed mainframe could be repaired.

Today, a multi-frame mainframe system such as existed in the 1970's and 1980's has been replaced with a single frame or rack. Thus, multiple system frames, from high end, mid-range and low end could now be sourced from a single computer room water conditioning unit such as depicted in FIGS. 1 & 2. Therein lies a problem, however. A single facility coolant leak or loss of chilled water source could bring down the entire computer room floor.

SUMMARY OF THE INVENTION

The above-noted shortcomings are overcome and additional advantages are provided through the provision of a cooling system for an electronics subsystem. The cooling system includes at least one coolant conditioning unit and at least one thermal capacitor unit. The at least one coolant conditioning unit includes a heat exchanger, a first cooling loop and a second cooling loop. The first cooling loop receives facility coolant and passes at least a portion thereof through the heat exchanger. The second cooling loop provides system coolant to the at least one electronics subsystem and expels heat in the heat exchanger from the at least one electronics subsystem to the facility coolant in the first cooling loop. The at least one thermal capacitor unit is in fluid communication with the second cooling loop of the at least one coolant conditioning unit to maintain temperature of the system coolant within a defined range for a period of time upon shutdown or failure of the facility coolant in the first cooling loop of the at least one coolant conditioning unit.

In another aspect, a cooled electronics system is provided. The cooled electronics system includes at least one electronics rack comprising a plurality of drawer units, and a cooling system. The cooling system includes at least one coolant conditioning unit and at least one thermal capacitor unit. The at least one coolant conditioning unit has a heat exchanger, a first cooling loop and a second cooling loop. The first cooling loop receives facility coolant and passes at least a portion thereof through the heat exchanger. The second cooling loop provides system coolant to the at least one electronics rack and expels heat in the heat exchanger from the at least one electronics rack to the facility coolant in the first cooling loop. The at least one thermal capacitor unit is in fluid communication with the second cooling loop and maintains temperature of the system coolant within a defined range for a period of time upon shutdown or failure of the facility coolant in the first cooling loop of the at least one coolant conditioning unit while the at least one electronics rack continues operation.

In a further aspect, a method of cooling at least one electronics subsystem is provided. This method includes: providing at least one coolant conditioning unit, the at least one coolant conditioning unit comprising a heat exchanger, a first cooling loop and a second cooling loop, the first cooling loop receiving facility coolant and passing at least a portion thereof through the heat exchanger, the second cooling loop providing system coolant to the at least one electronics subsystem, and expelling heat in the heat exchanger from the at least one electronics subsystem to the facility coolant in the first cooling loop; and providing at least one thermal capacitor unit in fluid communication with the second cooling loop of the at least one coolant conditioning unit to maintain temperature of the system coolant within a defined range for a period of time upon shutdown or failure of the facility coolant in the first cooling loop of the at least one coolant conditioning unit while the at least one electronics subsystem remains operational.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein "electronics subsystem" comprises any housing, frame, rack, compartment, etc., containing one or more heat generating components of a computer system or other electronics system requiring cooling. The term "electronics rack" includes any frame or rack having a heat generating component of a computer system or electronics system; and may be, for example, a stand alone computer processor having high, mid or low end processing capability. In one embodiment, an electronics rack may comprise multiple electronics drawers, at least some of which have one or more heat generating components requiring cooling.

One example of coolant within the coolant distribution unit, or more particularly within the multiple coolant conditioning units (CCUs) described herein, is water. However, the concepts disclosed are readily adapted to use with other types of coolant on both the facility side and the system side. For example, the coolant may comprise a brine, a fluorocarbon liquid, or other similar chemical coolant or a refrigerant, while still maintaining the advantages and unique features of the present invention.

As noted briefly above, power levels in computer equipment (primarily processors) have again risen to a level where they no longer can be simply air cooled. These components might thus be water cooled. Heat dissipated by the processor can be transferred to the water via a water cooled cold plate. Water typically available at customer locations (i.e., data centers) is not suitable for use in these cold plates. First, condensation formation is a concern as the temperature of the data center water, ranging from 7° C. to 15° C., is far below the room's dew point (typically 18–23° C.). Second, the relatively poor quality of the water (its chemistry, cleanliness, etc.) impacts system reliability. It is therefore desirable to utilize a water cooling/conditioning unit that circulates high quality water to/from the electronics to be cooled and rejects the heat to the data center water. As used herein, "facility water" or "facility coolant" refers to this data center water or coolant, while "system water" or "system coolant" refers to the cooled/conditioned water or coolant, respectively, circulating between the coolant distribution unit and the electronics subsystem being cooled.

Generally stated, provided herein is a scalable coolant distribution unit which sources cooled system coolant to a plurality of electronics racks from a bank of dedicated, modular coolant conditioning units (CCUs). For example, each electronics rack is connected to an associated CCU, wherein the CCU is dedicated to that particular electronics rack. Thus, a leak in any processor frame only causes that particular frame to fail. This significantly reduces the leak susceptibility in a cooled multi-rack computer environment. As explained in the above-incorporated applications, further improvement and reliability can be obtained by providing redundant CCUs and/or redundant facility coolant sources. This provides added protection against, for example, a heat exchanger failure, a control valve failure, or loss of chilled facility coolant from one source.

Figure 3:
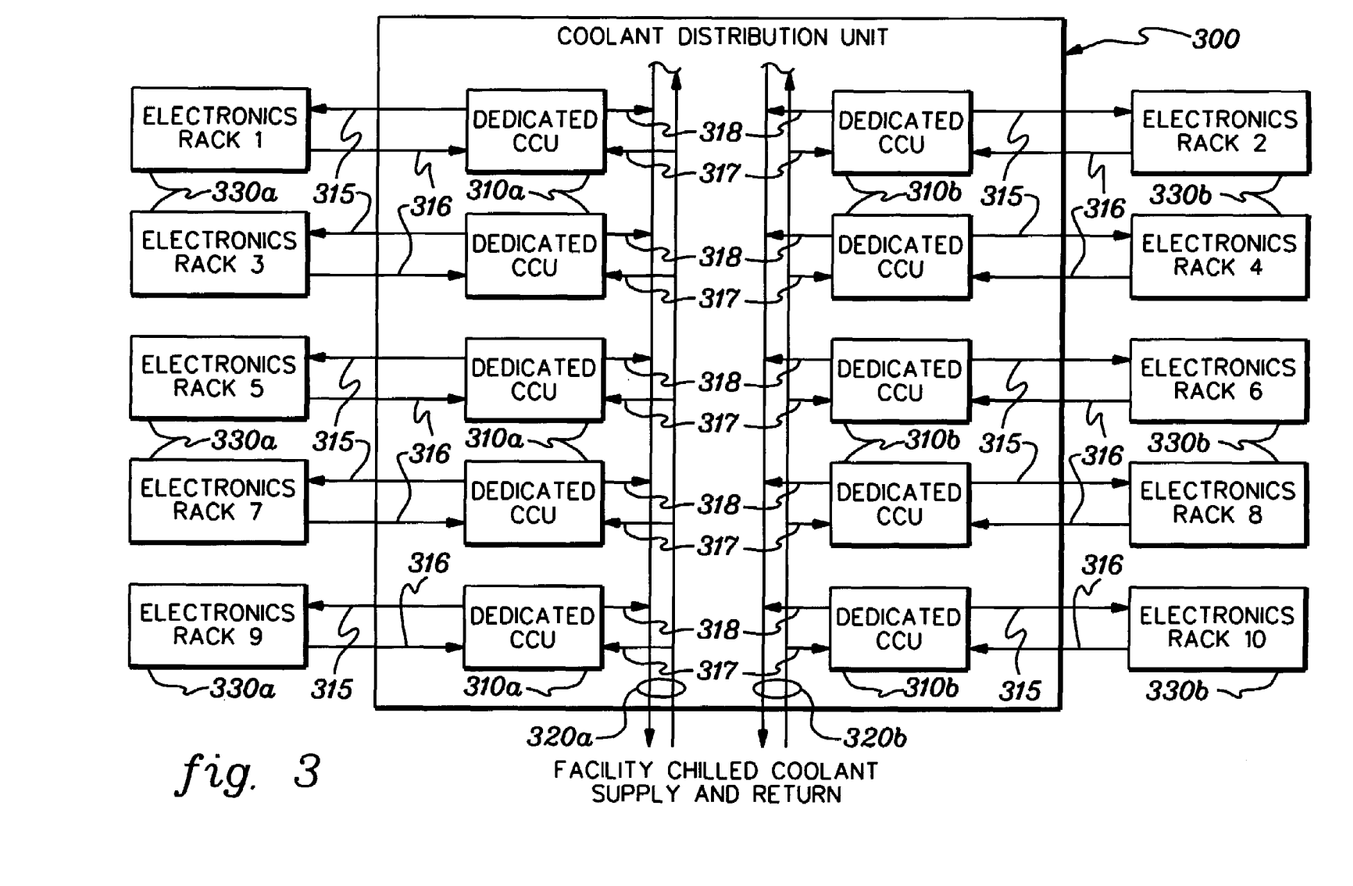
FIG. 3 depicts one embodiment of a coolant distribution unit employing multiple dedicated coolant conditioning units, in accordance with an aspect of the present invention.

FIG. 3 depicts one embodiment of a coolant distribution unit 300 in accordance with an aspect of the present invention. Unit 300 includes two banks of dedicated coolant conditioning units (CCUs) 310a, 310b. Each bank of dedicated CCUs is serviced by separate supply and return lines 320a, 320b for the chilled facility coolant. As shown, each dedicated CCU is connected to an associated electronics rack via a system coolant supply line 315 and a system coolant return line 316. In addition, each dedicated CCU 310a, 310b is coupled to the respective chilled facility coolant supply and return lines 320a, 320b via coolant inlet lines 317 and coolant outlet lines 318. Note that the ten electronics racks 330a, 330b example of FIG. 3 is shown by way of example only. Further, note that each CCU may have a structure similar to the CRWCU depicted in FIG. 2, but be sized with much smaller components. Variations on the modular CCU structure are also described in the above-incorporated applications.

As noted initially, once the cooling requirements are satisfied, equally important to a large server application is the need to ensure continuous computer operation. This requirement is usually measured in terms of availability or percentage of time throughout a year during which computers are expected to be operational. A typical requirement is now for 99.999% availability or an unplanned outage of no greater than approximately five minutes during an entire year. To achieve this objective, redundancy of system cooling components such as pumps, heat exchangers, and possibly even redundant water circuits may be employed to ensure satisfactory operation in the event of failure of a key cooling component.

In one embodiment, the modular cooling conditioning units may be connected to a single source of facility chilled water. Consequently, if the supply of facility chilled water fails, an entire computer complex may fail. For certain customer installations, this problem might be alleviated by the presence of dual separate sources of facility chilled water to which the modular cooling conditioning units may be connected. Unfortunately, many installations do not have and cannot install dual facility chilled water sources. Thus, disclosed herein is an approach to ensure continued operation notwithstanding failure of facility chilled water supply without shutting down a computer complex and without the need for dual sources of facility chilled water.

Figure 4:
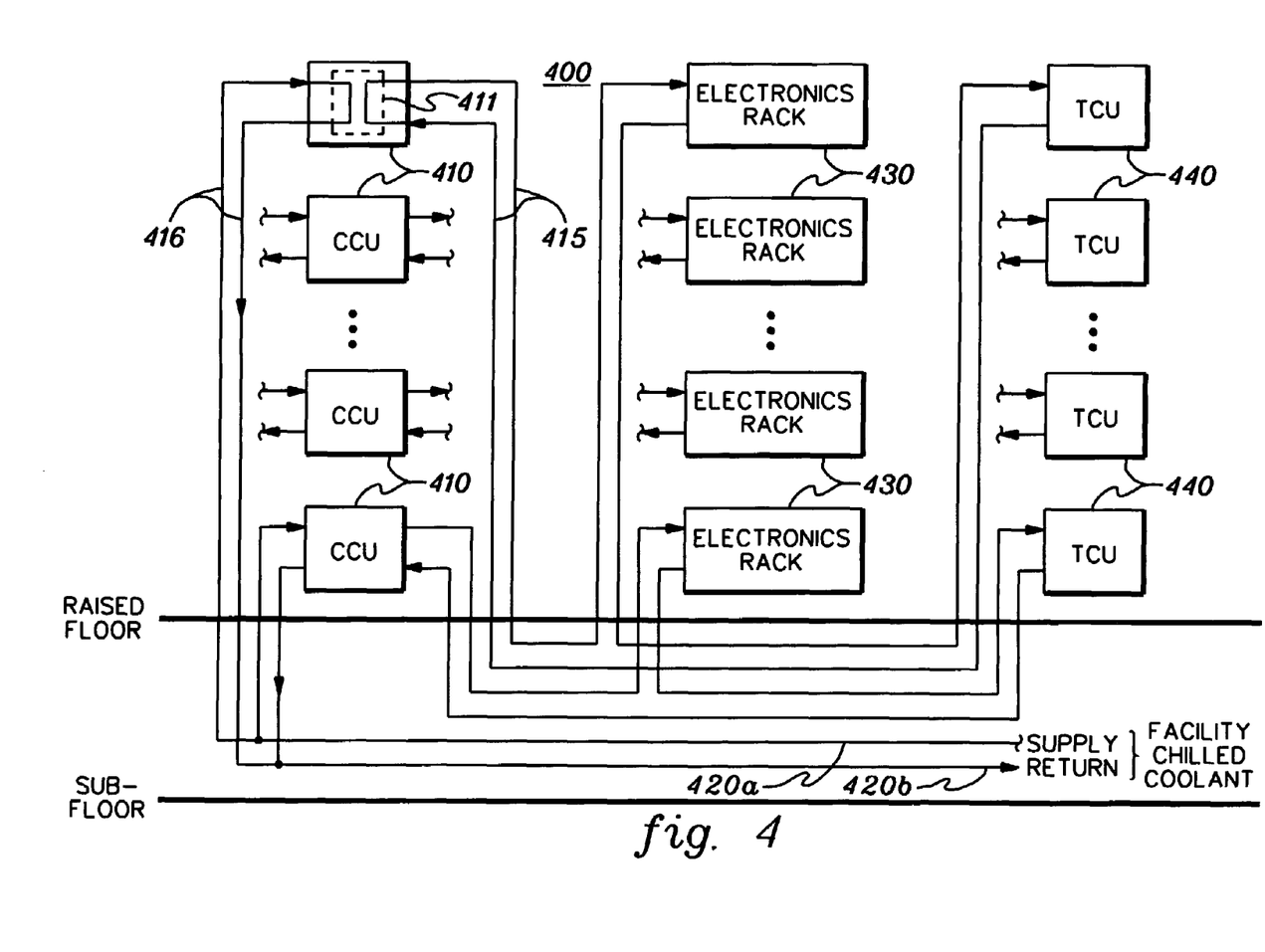
FIG. 4 depicts an alternate embodiment of a coolant distribution unit employing multiple dedicated coolant conditioning units, each with an associated, modular thermal capacitor unit, in accordance with an aspect of the present invention.

FIG. 4 depicts an alternate embodiment of a cooling system in accordance with an aspect of the present invention, wherein a coolant distribution unit 400 includes a bank of dedicated coolant conditioning units (CCUs) 410, which are serviced by common facility chilled coolant supply 420a and return 420b lines. As shown, each dedicated CCU is connected to an associated electronics rack 430 via a system cooling loop 415, and to the common facility coolant supply and return lines 420a, 420b via a facility coolant loop 416.

The coolant conditioning units include liquid-to-liquid heat exchangers 411 through which cooled facility coolant is passed via the first cooling loops 416. The second cooling loops 415 provide system coolant to the associated electronics racks 430 and expel heat in the heat exchangers from the associated electronics rack to the facility coolant in the respective first cooling loop.

In accordance with the embodiment of FIG. 4, each system cooling loop 415 is expanded to include at least one modular thermal capacitor unit (TCU) 440 in fluid communication therewith. In the example shown, system coolant flows from a respective CCU 410 through the associated electronics rack 430 and thereafter through an associated thermal capacitor unit 440 before returning to the coolant conditioning unit for expelling heat through the heat exchanger thereof. The TCU 440 facilitates maintaining temperature of the system coolant within a defined range for a period of time upon shutdown or failure of the facility coolant in the first cooling loop 416 of the associated coolant conditioning unit while the associated electronics rack remains operational.

Figure 5A:
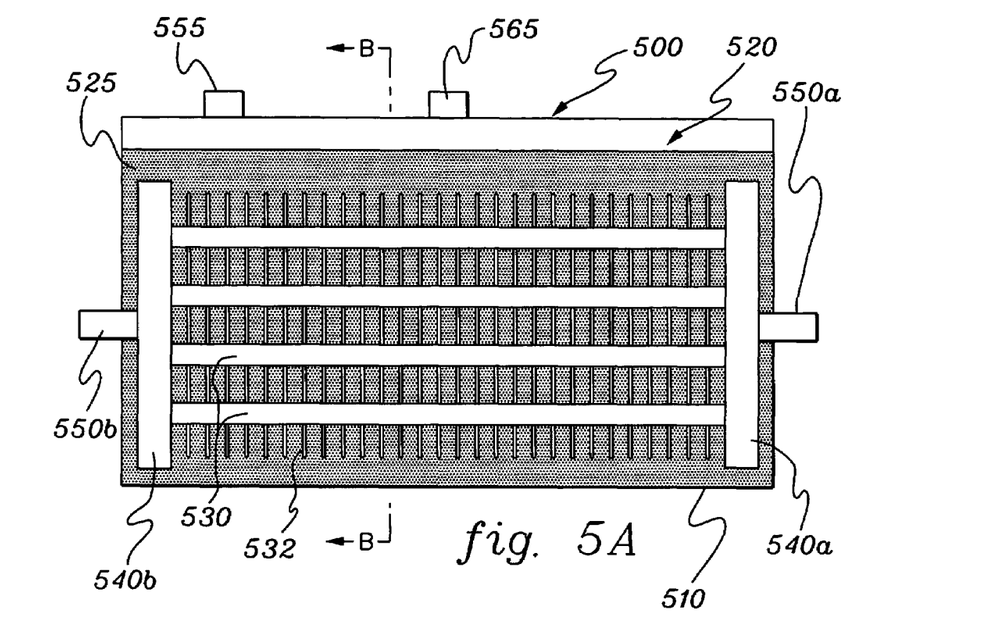
FIG. 5A is a cross-sectional view of one embodiment of a modular thermal capacitor unit taken along lines A—A of FIG. 5B, in accordance with an aspect of the present invention.
Figure 5B:
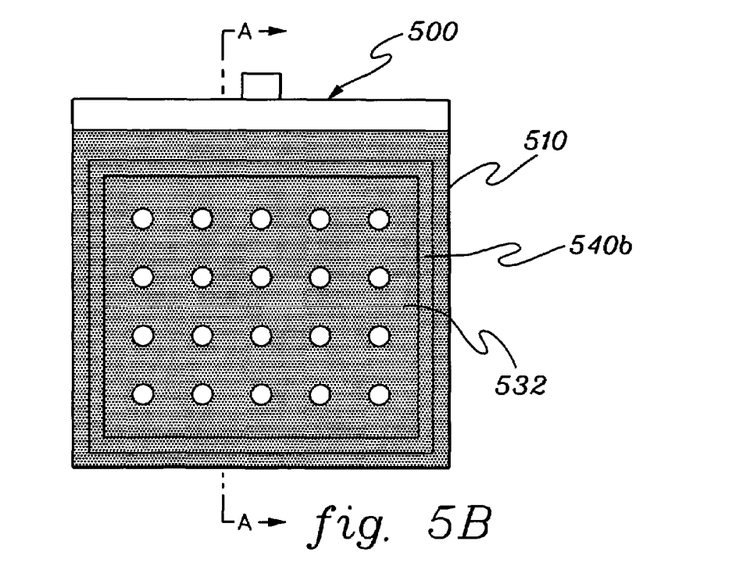
FIG. 5B is a cross-sectional view of the thermal capacitor unit embodiment of FIG. 5A taken along line B—B, in accordance with an aspect of the present invention.

One embodiment of a modular thermal capacitor unit 500, in accordance with an aspect of the present invention, is shown in FIGS. 5A & 5B. In this embodiment, thermal capacitor unit 500 comprises a sealed container or housing 510 with an inner chamber 520 which contains a phase change material 525. A plurality of coolant flow tubes 530 pass through chamber 520 between an inlet plenum 540a and an outlet plenum 540b. When the thermal capacitor unit is inserted into the system coolant loop between, for example, an electronics frame and a coolant conditioning unit, system coolant is received into the inlet plenum through a system coolant inlet 550a, passes through the coolant flow tubes to the outlet plenum, and is returned to the system coolant loop through a system coolant outlet 550b. The plurality of coolant flow tubes have a plurality of thermal conduction fins 532 extending therefrom. Fins 532 serve to increase the surface area in contact with the phase change material. In one embodiment, the plurality of thermal conduction fins may comprise thermally conductive plate fins surrounding the coolant flow tubes. One thermally conductive plate fin 532 is shown in FIG. 5B.

Phase change material 525 surrounds the plurality of coolant flow tubes 530 and the plurality of thermal conduction fins 532. Phase change material 525 is a low melting point phase change material, such as TH29 available from PCM Thermal Solutions of Naperville, Ill. Material TH29 has a melting point of 29° C. Should the electronics rack heat load raise system water temperature to above the melting point of the phase change material, then heat from the system water will be absorbed into the phase change material as latent heat due to melting of the material. The temperature of the system water leaving the TCU will remain at a level near the melting point of the phase change material during this process. By appropriately sizing the amount of phase change material, a defined period of time (e.g., approximately 15 minutes) can be provided to address a facility chilled coolant failure and allow restoration of the coolant distribution system to normal operation. Advantageously, the thermal capacitor units are auxiliary or emergency heat extraction units, and are totally passive, not requiring any sensor or active control to bring the units into operation.

Assembly of thermal capacitor unit 500 can be accomplished by placing an assembled heat exchange substructure comprising the plurality of coolant flow tubes, thermal conduction fins, inlet and outlet plenums, and system coolant inlet and outlet within a closed containment housing or chamber. Prior to filling the thermal capacitor unit with molten phase change material, the housing and heat exchange substructure are heated to a temperature above the melting point of the phase change material. Then a vacuum can be established on the inside of the containment housing via a vent port 555, i.e., to minimize voids within the phase change material, and the free volume within the containment housing is filled by pouring the molten phase change material through a fill port 565 into the chamber. An air pocket is left at the top of the chamber so that as the phase change material melts, there is no potential for an excessive hydrostatic pressure to develop. The chamber is sealed and the thermal capacitor unit is allowed to cool, thereby solidifying the phase change material.

During operation of the computer complex, heated system water passes through the plurality of coolant flow tubes and heat may be thermally conducted through the fins and into the phase change material. Under normal operation, the temperature within the TCU is below the solid-to-liquid transition temperature of the phase change material. However, upon failure of the facility coolant, the temperature of the system coolant will rise, with the temperature of the phase change material rising to that of the system coolant exiting the electronics rack. Once the system water exiting the electronics rack reaches the melting point temperature of the phase change material, the rise in system water temperature will stabilize and remain substantially constant throughout the phase change material melting process, providing time needed to restore operation of the facility chilled water supply (see FIG. 6). If the facility chilled water is not restored within this period of time, the system water will start to rise again at a rate comparable to that to which would have taken place without the auxiliary thermal capacitor unit being in thermal communication with the system coolant loop. Once facility coolant is restored, the system coolant temperature and the thermal capacitor unit will begin to cool down. As this happens, the phase change material will re-solidify as heat is released via the plurality of fins and plurality of coolant flow tubes into the system coolant, and thereafter is conducted to the heat exchanger of the coolant conditioning unit for removal to the facility coolant.

Figure 6:
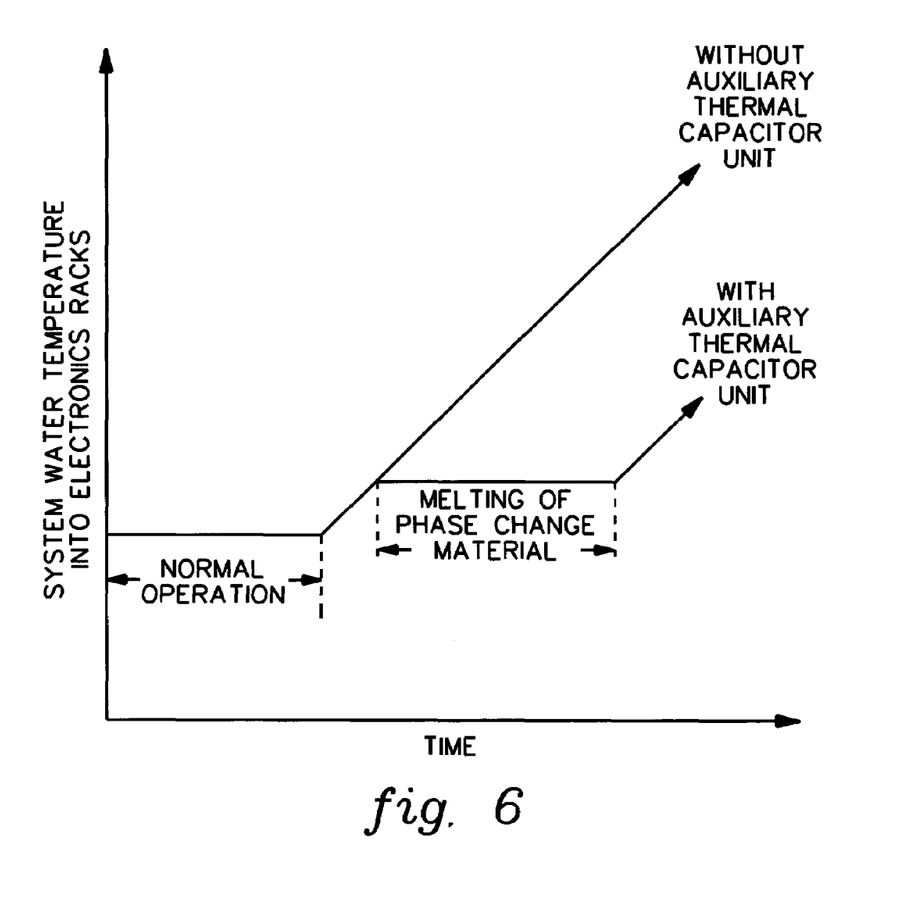
FIG. 6 graphically illustrates an example of system water temperature into an electronics rack versus time responsive to failure of facility coolant in a first cooling loop of a coolant conditioning unit providing system coolant (i.e., system water in this example) to the electronics rack, both without the use of a thermal capacitor unit, and with the use of a thermal capacitor unit, in accordance with an aspect of the present invention.

FIG. 6 is a graph of system coolant temperature response following failure of facility coolant to coolant distribution units such as depicted in FIGS. 3 & 4. With the embodiment of FIG. 4, upon loss of facility coolant, system water temperature will increase until reaching the melting point of the phase change material, at which point the system coolant temperature will remain substantially stable until the phase change material has melted. Thereafter, system coolant temperature increases in a manner similar to the increase experienced with the embodiment of FIG. 3, i.e., without the existence of the thermal capacitor unit coupled in series with the system coolant.

Physically, a frame containing modular thermal capacitor units such as described herein could be placed near one or more associated coolant conditioning units or elsewhere in a computer room, provided that the total length of the system coolant loop does not exceed a design specification. The thermal capacitor units are modular and can be readily retrofitted to existing computer rooms. Further, multiple thermal capacitor units could be provided in series within a given system coolant loop in order to provide a desired amount of auxiliary cooling. The thermal capacitor units are located remotely from the associated electronics rack and are a separate structure therefrom. The auxiliary cooling provided by the modular thermal capacitor units allows time for, for example, restoration of facility coolant. In one embodiment, a plurality of thermal capacitor units can be provided in a frame within the computer room. Further, if appropriately sized, a single coolant conditioning unit and a single thermal capacitor unit could be employed to cool multiple electronics racks.

Those skilled in the art will note from the above discussion that applications of a thermal capacitor unit such as disclosed herein are not restricted to the specific TH29 phase change material noted above. Various phase change materials are available in the art with a range of melting point temperatures, many of which could be employed in a thermal capacitor unit as disclosed herein.

Although preferred embodiments have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. A cooling system comprising:
at least one coolant conditioning unit, the at least one coolant conditioning unit comprising a heat exchanger, a first cooling loop and a second cooling loop, the first cooling loop receiving facility coolant and passing at least a portion thereof through the heat exchanger, the second cooling loop providing system coolant to at least one electronics subsystem, and expelling heat in the heat exchanger from the at least one electronics subsystem to the facility coolant in the first cooling loop; and
at least one thermal capacitor unit in fluid communication with the second cooling loop of the at least one coolant conditioning unit to maintain temperature of the system coolant within a defined range for a period of time upon shutdown or failure of the facility coolant in the first cooling loop of the at least one coolant conditioning unit.

2. The cooling system of claim 1, wherein when the cooling system is in operation, system coolant flows through the second cooling loop from the heat exchanger of the at least one coolant conditioning unit to the at least one electronics subsystem and then to the at least one thermal capacitor unit, before returning back to the heat exchanger of the at least one coolant conditioning unit.

3. The cooling system of claim 1, wherein the at least one thermal capacitor unit includes at least one housing comprising a chamber with a phase change material disposed therein, wherein the phase change material maintains temperature of the system coolant substantially constant within the predefined range for the period of time upon shutdown or failure of the facility coolant in the first cooling loop.

4. The cooling system of claim 3, wherein the at least one thermal capacitor unit further comprises a plurality of coolant flow tubes passing through the chamber of the at least one housing, the plurality of coolant flow tubes having a plurality of thermal conduction fins coupled thereto, and wherein the phase change material at least partially surrounds the plurality of coolant flow tubes and the plurality of thermal conduction fins coupled thereto, the plurality of thermal conduction fins facilitating heat transfer between system coolant in the plurality of coolant flow tubes and the phase change material.

5. The cooling system of claim 4, wherein the at least one housing further comprises an inlet plenum and an outlet plenum in fluid communication with the second cooling loop, wherein when the cooling system is in operation, system coolant passes from the second cooling loop through the inlet plenum, to the plurality of coolant flow tubes, then through the outlet plenum back to the second cooling loop for return to the heat exchanger of the at least one coolant conditioning unit.

6. The cooling system of claim 4, wherein the plurality of thermal conduction fins comprise a plurality of plate fins, and wherein the plurality of coolant flow tubes pass through the plurality of plate fins and are coupled thereto for extraction of heat from system coolant passing through the plurality of coolant flow tubes upon shutdown or failure of the facility coolant in the first cooling loop of the at least one coolant conditioning unit.

7. The cooling system of claim 1, wherein the at least one coolant conditioning unit is multiple coolant conditioning units, the at least one electronics subsystem is multiple electronics subsystems, and the at least one thermal capacitor unit is multiple thermal capacitor units, and wherein each coolant conditioning unit provides system coolant to a different, associated electronics subsystem of the multiple electronics subsystems to be cooled, and wherein system coolant of the second cooling loop of each coolant conditioning unit passes from the associated electronics subsystem through an associated thermal capacitor unit of the multiple thermal capacitor units before returning to the coolant conditioning unit.

8. The cooling system of claim 7, wherein the multiple electronics subsystems comprise multiple electronics racks, and wherein facility coolant is provided from a common source to each of the multiple coolant conditioning units.

9. A cooled electronics system comprising:
at least one electronics rack comprising a plurality of drawer units; and
a cooling system comprising:
    at least one coolant conditioning unit, the at least one coolant conditioning unit comprising a heat exchanger, a first cooling loop and a second cooling loop, the first cooling loop receiving facility coolant and passing at least a portion thereof through the heat exchanger, the second cooling loop providing system coolant to the at least one electronics rack, and expelling heat in the heat exchanger from the at least one electronics rack to the facility coolant in the first cooling loop; and
    at least one thermal capacitor unit in fluid communication with the second cooling loop of the at least one coolant conditioning unit to maintain temperature of the system coolant within a defined range for a period of time upon shutdown or failure of the facility coolant in the first cooling loop of the at least one coolant conditioning unit.

10. The cooled electronics system of claim 9, wherein when the cooled electronics system is operational, system coolant flows through the second cooling loop from the heat exchanger of the at least one coolant conditioning unit to the at least one electronics rack and then to the at least one thermal capacitor unit and back to the heat exchanger of the at least one coolant conditioning unit.

11. The cooled electronics system of claim 9, wherein the facility coolant is provided from a common source to the at least one coolant conditioning unit.

12. The cooled electronics system of claim 11, wherein the at least one electronics rack is multiple electronics racks, and the at least one coolant conditioning unit of the cooling system is multiple coolant conditioning units, and the at least one thermal capacitor unit is multiple thermal capacitor units, and wherein the facility coolant is provided to the multiple coolant conditioning units from the common source.

13. The cooled electronics system of claim 12, wherein at least one coolant conditioning unit provides system coolant to at least one associated electronics rack of the multiple electronics racks to be cooled, and wherein system coolant of the second cooling loop of the at least one coolant conditioning unit passes from the at least one associated electronics rack through at least one associated thermal capacitor unit of the multiple thermal capacitor units before returning to the at least one coolant conditioning unit.

14. The cooled electronics system of claim 9, wherein the at least one thermal capacitor unit comprises at least one housing including a chamber with a phase change material disposed therein, wherein the phase change material maintains temperature of the system coolant substantially constant within the predefined range for the period of time upon shutdown or failure of the facility coolant in the first cooling loop while the at least one electronics rack remains operational.

15. The cooled electronics system of claim 14, wherein the at least one thermal capacitor unit further comprises a plurality of coolant flow tubes passing through the chamber of the at least one housing, the plurality of coolant flow tubes including a plurality of thermal conduction fins coupled thereto, and wherein the phase change material at least partially surrounds the plurality of coolant flow tubes and the plurality of thermal conduction fins coupled thereto, the plurality of thermal conduction fins facilitating heat transfer between system coolant in the plurality of coolant flow tubes and the phase change material.

16. The cooled electronics system of claim 15, wherein the at least one housing further comprises an inlet plenum and an outlet plenum in fluid communication with the second cooling loop, wherein when the cooling system is operational, system coolant passes from the second cooling loop through the inlet plenum, to the plurality of coolant flow tubes, then through the outlet plenum back to the second cooling loop for return to the heat exchanger of the at least one coolant conditioning unit.

17. The cooled electronics system of claim 15, wherein the plurality of thermal conduction fins comprise a plurality of plate fins, and wherein the plurality of coolant flow tubes pass through the plurality of plate fins and are coupled thereto for facilitating transfer of heat from system coolant passing through the plurality of coolant flow tubes upon shutdown or failure of the facility coolant in the first cooling loop of the at least one coolant conditioning unit while the at least one electronics rack remains operational.

18. A method of cooling at least one electronics subsystem, the method comprising:
providing at least one coolant conditioning unit, the at least one coolant conditioning unit comprising a heat exchanger, a first cooling loop and a second cooling loop, the first cooling loop receiving facility coolant and passing at least a portion thereof through the heat exchanger, the second cooling loop providing system coolant to the at least one electronics subsystem, and expelling heat in the heat exchanger from the at least one electronics subsystem to the facility coolant in the first cooling loop; and
providing at least one thermal capacitor unit in fluid communication with the second cooling loop of the at least one coolant conditioning unit to maintain temperature of the system coolant within a defined range for a period of time upon shutdown or failure of the facility coolant in the first cooling loop of the at least one coolant conditioning unit while the at least one electronics subsystem remains operational.

19. The method of claim 18, further comprising coupling the at least one coolant conditioning unit, the at least one electronics subsystem, and the at least one thermal capacitor unit in fluid communication, wherein system coolant flows through the second coolant loop of the at least one cooling conditioning unit from the heat exchanger thereof to the at least one electronics subsystem and then to the at least one thermal capacitor unit, before returning back to the heat exchanger of the at least one coolant conditioning unit.

20. The method of claim 19, further comprising coupling the first cooling loop of the at least one coolant conditioning unit to a common source of facility coolant.

21. The method of claim 18, wherein the providing of the at least one thermal capacitor unit further includes assembling the at least one thermal capacitor unit, the assembling including providing at least one housing having a chamber with a plurality of coolant flow tubes passing therethrough, the plurality of coolant flow tubes including a plurality of thermal conduction fins coupled thereto, wherein the plurality of thermal conduction fins facilitate heat transfer between system coolant in the plurality of coolant flow tubes and the phase change material, and wherein the at least one housing further includes an inlet plenum and an outlet plenum to be placed in fluid communication with the second cooling loop, and wherein the method further comprises heating the housing, with the plurality of coolant flow tubes and plurality of thermal conduction fins therein to a temperature above a melting temperature of a phase change material, and at least partially filling the chamber with molten phase change material, and thereafter allowing the molten phase change material to solidify.

22. The method of claim 21, wherein the assembling of the at least one thermal capacitor unit further comprises establishing a partial vacuum within the chamber prior to introducing molten phase change material into the chamber, wherein solidifying of the phase change material comprises allowing the phase change material to cool.

23. The method of claim 21, wherein when cooling the at least one electronics subsystem, system coolant passes from the at least one electronics subsystem via the second cooling loop through the inlet plenum, the plurality of coolant flow tubes, and then the outlet plenum back to the second cooling loop for return to the heat exchanger of the at least one coolant conditioning unit, wherein heat is extracted from the system coolant passing through the plurality of coolant flow tubes upon shutdown or failure of the facility coolant in the first cooling loop of the at least one coolant conditioning unit while the at least one electronics subsystem remains operational.

* * * * *